US012615949B2

(12) United States Patent
Yin et al.

(10) Patent No.: US 12,615,949 B2
(45) Date of Patent: Apr. 28, 2026

(54) DISPLAY PANEL

(71) Applicant: Shenzhen China Star Optoelectronics Semiconductor Display Technology Co., Ltd., Shenzhen (CN)

(72) Inventors: Zhiyuan Yin, Shenzhen (CN); Ting Shi, Shenzhen (CN); Qian Wu, Shenzhen (CN)

(73) Assignee: SHENZHEN CHINA STAR OPTOELECTRONICS SEMICONDUCTOR DIS-PLAY TECHNOLOGY CO., LTD., Shenzhen (CN)

( * ) Notice: Subject to any disclaimer, the term of this patent is extended or adjusted under 35 U.S.C. 154(b) by 422 days.

(21) Appl. No.: 17/624,007

(22) PCT Filed: Dec. 21, 2021

(86) PCT No.: PCT/CN2021/140157
§ 371 (c)(1),
(2) Date: Dec. 30, 2021

(87) PCT Pub. No.: WO2023/108727
PCT Pub. Date: Jun. 22, 2023

(65) Prior Publication Data
US 2023/0200120 A1     Jun. 22, 2023

(30) Foreign Application Priority Data

Dec. 17, 2021     (CN) .......................... 202111552715.4

(51) Int. Cl.
*H10K 59/80*          (2023.01)
(52) U.S. Cl.
CPC ........... *H10K 59/879* (2023.02); *H10K 59/87* (2023.02)

(58) Field of Classification Search
CPC .... H10K 50/858; H10K 50/84; H10K 59/879; H01L 51/52
See application file for complete search history.

(56) References Cited

U.S. PATENT DOCUMENTS 7,889,289 B2 * 2/2011 Misono ................ G02B 6/0053
349/64
2005/0007793 A1 1/2005 Yoshida
(Continued)

FOREIGN PATENT DOCUMENTS

| CN | 101025452 A | 8/2007 |
| CN | 103984048 A | 8/2014 |

(Continued)

OTHER PUBLICATIONS

English Machine Translation of Lin et al WIPO No. 2020/181447 (Year: 2024).*

(Continued)

*Primary Examiner* — Donald L Raleigh
(74) *Attorney, Agent, or Firm* — Rivka Friedman

(57)          ABSTRACT

A display panel includes a light-emitting substrate and an optical layer. The light-emitting substrate includes a light-emitting surface. The optical layer is disposed on the light-emitting surface of the light-emitting substrate and includes a prism to refract light emitted from the light-emitting substrate. The prism of the optical layer includes a bottom surface, a top surface, and a plurality of side surfaces connecting the bottom surface and the top surface. The bottom surface and the top surface are parallel to the light-emitting substrate. The bottom surface is arranged adjacent to the light-emitting substrate. The top surface is arranged away from the light-emitting substrate. An area of the top surface is smaller than an area of the bottom surface.

16 Claims, 6 Drawing Sheets

(56)                References Cited

U.S. PATENT DOCUMENTS

| | | | |
|---|---|---|---|
| 2007/0297194 A1 | 12/2007 | Tsai | |
| 2013/0087777 A1* | 4/2013 | Harai | H10K 50/858 |
| | | | 257/40 |
| 2014/0014938 A1* | 1/2014 | Harai | H10K 59/878 |
| | | | 257/40 |
| 2019/0123235 A1* | 4/2019 | Cho | H10H 20/821 |
| 2020/0185652 A1 | 6/2020 | Sun | |
| 2020/0201033 A1 | 6/2020 | Song | |

FOREIGN PATENT DOCUMENTS

| | | | | | |
|---|---|---|---|---|---|
| CN | 106842682 | A | 6/2017 | | |
| CN | 109524568 | A | 3/2019 | | |
| CN | 109581799 | A | 4/2019 | | |
| CN | 110928021 | A | 3/2020 | | |
| CN | 113687532 | A | 11/2021 | | |
| JP | 2007155968 | A | 6/2007 | | |
| JP | 2008003245 | A | 1/2008 | | |
| JP | 2014115501 | A | 6/2014 | | |
| KR | 20200078796 | A | 7/2020 | | |
| TW | M608872 | U | 3/2021 | | |
| WO | 2013135873 | A1 | 9/2013 | | |
| WO | WO-2020181447 | A1 * | 9/2020 | .......... | G02B 5/0231 |

OTHER PUBLICATIONS

English Machine Translation of Lin et al WO 2020181447 (Year: 2024).*

International Search Report in International application No. PCT/CN2021/140157,mailed on Jun. 29, 2022.

Written Opinion of the International Search Authority in International application No. PCT/CN2021/140157,mailed on Jun. 29, 2022.

Chinese Office Action issued in corresponding Chinese Patent Application No. 202111552715.4 dated May 6, 2023, pp. 1-8.

Japanese Office Action issued in corresponding Japanese Patent Application No. 002021-576742 dated Feb. 6, 2024, pp. 1-6.

* cited by examiner 100      200      300

100      300      200

DISPLAY PANEL

FIELD OF INVENTION

The present invention is related to the field of display technology and specifically to a display panel with a smooth viewing brightness change curve at different viewing angles.

BACKGROUND OF INVENTION

Organic light-emitting diode (OLED) display panels have advantages of wide viewing angles and wide color gamut, and become mainstream display panels, it has been paid attention and developed by major display device manufacturers. In order to further enhance color point luminous efficiency of the OLED display panels, structures and manufacturing processes of OLED devices in the OLED display panel need to be improved.

Based on different manufacturing methods, the OLED devices are mainly classified into vapor-deposited OLED devices and printed OLED devices, and both of them have different technical advantages. However, due to dimensional tolerances or production yield during manufacturing, in either the vapor-deposited OLED devices or the printed OLED devices, their recombination positions of excitons formed by electrons and holes in light-emitting layers cannot completely meet design requirements. Therefore, when the recombination positions of the excitons are shifted from predetermined positions, a maximum brightness of light emitting from the excitons cannot be observed at a viewing angle of 0 degree (observers directly look at the OLED display panels), but may be observed at side viewing angles (observers look at the OLED display panels sideways).

Please refer to FIG. 1, which is a brightness-viewing angle relationship graph of an OLED display panel in prior art. According to theory, it is assumed that a brightness of the OLED display panel in the prior art should be observed with a maximum value at a viewing angle of 0 degree, which means that the brightness of the viewing angle of 0 degrees is 100%, and the brightness will gradually decrease as the viewing angle tilt. It can be seen from FIG. 1 that brightness observation results at different viewing angles show that, in fact, a brightness of the OLED display panel in the prior art observed at a viewing angle of plus or minus 30 degrees is greater than a brightness observed at the viewing angle of 0 degrees.

Since a recombination position of excitons in a light-emitting layer of an OLED device in the prior art is uncertain, the above-mentioned phenomenon of a brightness fluctuation (i.e., bright wave) can be observed in the brightness-viewing angle relationship graph. This means that a viewing brightness change curve of the OLED display panel at different viewing angles is not smooth. Moreover, the brightness fluctuation problem will be observed at horizontal viewing angles or vertical viewing angles, which affects user viewing experience.

In the prior art, in order to solve the problem of the uncertain recombination position of the excitons in the light-emitting layer of the OLED device, it is generally achieved by replacing constituent materials of the light-emitting layer or adding a new transmission layer, so as to further restrict the recombination position of the excitons. However, while improving an accuracy of the recombination position of the excitons, the prior art increases a number of manufacturing processes of the OLED display device and reduces a luminous efficiency of the OLED device.

SUMMARY OF INVENTION

The present invention provides a display panel with a smooth viewing brightness change curve at different viewing angles, which can relieve a problem an organic light-emitting diode (OLED) display panel in prior art due to an uncertain recombination position of excitons in a light-emitting layer of an OLED device, thereby optimizing user viewing experience.

The display panel provides by the present invention includes a light-emitting substrate and an optical layer. The light-emitting substrate includes a light-emitting surface. The optical layer is disposed on the light-emitting surface of the light-emitting substrate and includes a prism to refract light emitted from the light-emitting substrate. The prism of the optical layer includes a bottom surface, a top surface, and a plurality of side surfaces connecting the bottom surface and the top surface. The bottom surface and the top surface are parallel to the light-emitting substrate. The bottom surface is arranged adjacent to the light-emitting substrate. The top surface is arranged away from the light-emitting substrate. An area of the top surface is smaller than an area of the bottom surface.

In an embodiment, the bottom surface of the prism is rectangular. Two side surfaces on a pair of opposite sides connecting the bottom surface and the top surface are symmetrical to each other.

In an embodiment, each of the side surfaces of the prism includes a flat surface.

In this embodiment, each of the side surfaces of the prism further includes a plurality of sub-flat surfaces.

In an embodiment, normal directions of two adjacent sub-flat surfaces of each of the side surfaces of the prism are different.

In an embodiment, a distance between the bottom surface and the top surface of the prism ranges from 5 to 50 microns.

In this embodiment, the distance between the bottom surface and the top surface of the prism is 20 microns.

In an embodiment, a width of the bottom surface of the prism ranges from 5 to 50 microns.

In this embodiment, the width of the bottom surface of the prism is 15 microns.

In an embodiment, an angle between an average normal direction of each of the side surfaces of the prism and a normal direction of the bottom surface ranges from 50 to 85 degrees.

In an embodiment, the optical layer includes a plurality of the prisms, and the prisms are arranged at intervals along a first direction on the light-emitting surface of the light-emitting substrate.

In this embodiment, a distance between two adjacent prisms ranges from 5 to 50 microns.

In this embodiment, the distance between two adjacent prisms is 10 microns.

In an embodiment, the optical layer includes a plurality of the prisms. The prisms are arranged in an array along a first direction and a second direction on the light-emitting surface of the light-emitting substrate, and the first direction and the second direction are perpendicular to each other.

In this embodiment, a distance between two adjacent prisms ranges from 5 to 50 microns.

In this embodiment, the distance between two adjacent prisms is 10 microns.

In an embodiment, a material of the prism includes resin.

In an embodiment, the prism is formed by an imprinting process or a photolithography process.

In an embodiment, the display panel further includes a packaging cover plate disposed on the optical layer.

In an embodiment, the display panel further includes a packaging cover plate disposed between the light-emitting substrate and the optical layer.

The present invention provides the display panel with the smooth viewing brightness change curve at different viewing angles. The optical layer in the display panel is disposed on the light-emitting surface of the light-emitting substrate, and the prism of the optical layer has the inclined side surfaces, which can refract the light emitted from the light-emitting substrate. Furthermore, each of the side surfaces of the prism may include one flat surface or a plurality of sub-flat surfaces with different inclined angles, so a viewing brightness change curve of the display panel of the present invention can be optimized, thereby relieving a problem of a brightness fluctuation occurring to the prior art. In addition, in order to enhance a technical effect of the optical layer at horizontal viewing angles or vertical viewing angles, the optical layer further includes a plurality of the prisms arranged at intervals along the first direction on the light-emitting surface of the light-emitting substrate, or arranged in an array along the first direction and the second direction perpendicular to each other. Beneficial to the technical effect and manufacturing flexibility of the optical layer, the optical layer designed through optical simulation experiments can adapt to any kind of display panel and optimize user viewing experience.

DETAILED DESCRIPTION OF EMBODIMENTS

In order to make above purposes, features, and advantages of the present invention more obvious and understandable, the following is a detailed description of preferred embodiments of the present invention in conjunction with accompanying drawings.

Figure 2:
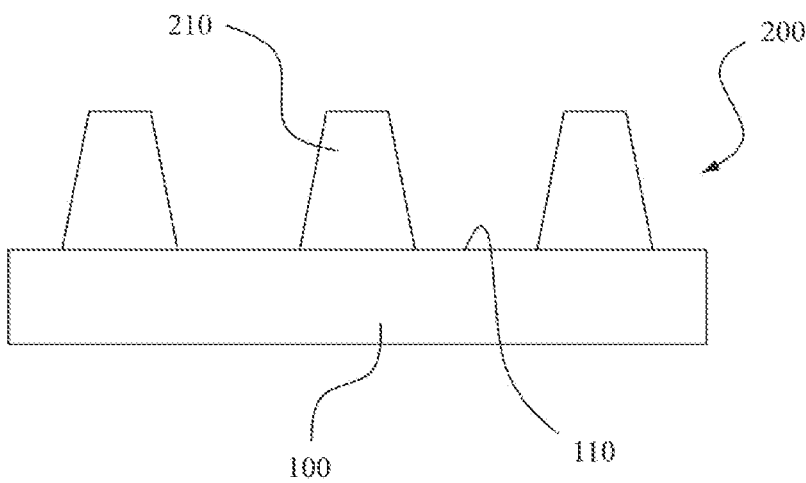
FIG. 2 is a schematic diagram of a laminated structure of a display panel of the present invention.

Please refer to FIG. 2, which is a schematic diagram of a laminated structure of a display panel of the present invention. The display panel of the present invention includes a light-emitting substrate 100 and an optical layer 200. The light-emitting substrate 100 includes a light-emitting surface 110. The optical layer 200 is disposed on the light-emitting surface 110 of the light-emitting substrate 100 and includes a prism 210 to refract the light emitted from the light-emitting substrate 100.

In this embodiment, the light-emitting substrate 100 is an organic light-emitting diode (OLED) display substrate. However, the light-emitting substrate 100 of the display panel of the present invention is not limited to this, and may also include a liquid crystal display substrate, a quantum dot display substrate, a mini-light-emitting diode (mini-LED) display substrate, or a micro-light-emitting diode (micro-LED) display substrate, etc.

Figure 3:
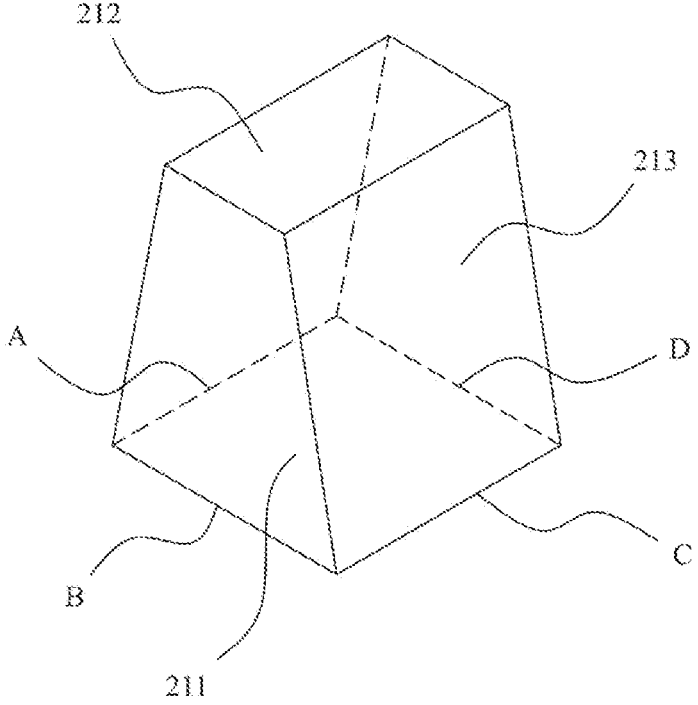
FIG. 3 is a three-dimensional schematic diagram of a prism in an optical layer of the present invention.

Please refer to FIG. 3, which is a three-dimensional schematic diagram of the prism 210 in the optical layer 200 of the present invention. The prism 210 in the optical layer 200 includes a bottom surface 211, a top surface 212, and a plurality of side surfaces 213 connecting the bottom surface 211 and the top surface 212. The bottom surface 211 and the top surface 212 are parallel to the light-emitting substrate 100 shown in FIG. 2. The bottom surface 211 is arranged adjacent to the light-emitting substrate 100. The top surface 212 is arranged away from the light-emitting substrate 100.

Figure 1:
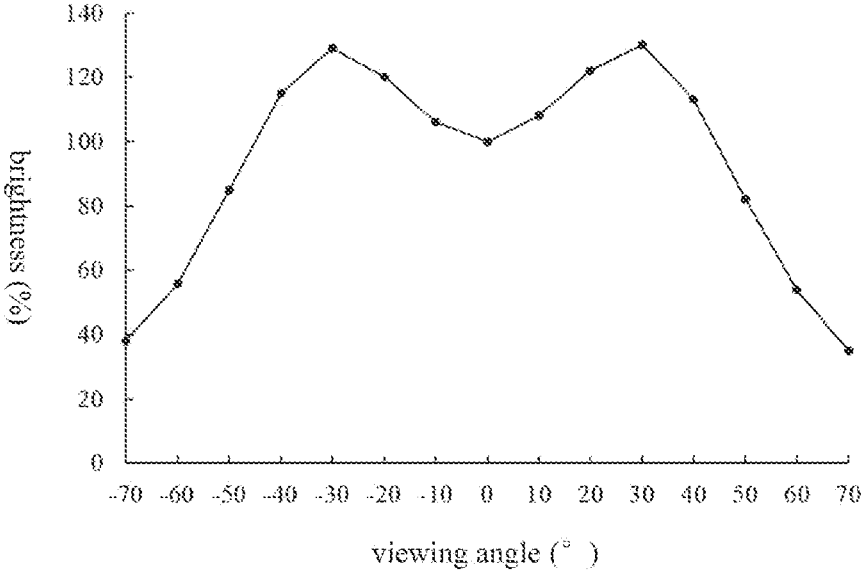
FIG. 1 is a brightness-viewing angle relationship graph of an organic light-emitting diode (OLED) display panel in prior art.

The present invention performs optical simulation experiments of the prism 210 of the optical layer 200 according to the brightness-viewing angle relationship graph of the OLED display panel in the prior art shown in FIG. 1 to design a prism structure that can relieve a phenomenon of brightness fluctuation (i.e., bright wave) observed in FIG. 1.

Through the optical simulation experiments, the present invention configures an area of the top surface 212 of the prism 210 to be smaller than an area of the bottom surface 211. Therefore, any one of the side surfaces 213 of the prism 210 will be inclined toward an inner side of the prism 210 to form a prism structure that is wide at the bottom and narrow at the top.

As shown in FIG. 3, in an embodiment, the bottom surface 211 of the prism 210 is configured to be rectangular, and the top surface 212 of the prism 210 may also be configured to be rectangular correspondingly. The rectangular bottom surface 211 includes four sides A, B, C, and D, which face each other in pairs. Among the side surfaces 213 of the prism 210, two side surfaces 213 connecting the bottom surface 211 and the top surface 212 of one pair of opposite sides A and C or the other pair of opposite sides B and D are symmetrical to each other. In other words, a shape of one of the side surfaces 213 on the side A is symmetrical with a shape of one of the side surfaces 213 on the side C, or a shape of one of the side surfaces 213 on the side B is symmetrical with a shape of one of the side surfaces 213 on the side D.

In this embodiment, a shape of the prism 210 may be a trapezoidal-column-shaped prism 210 shown in FIG. 3. Each of the side surfaces 213 of the prism 210 includes a flat surface but is not limited thereto. The present invention exemplarily provides the prism 210 of each of the side surfaces 213 in other shapes. Please refer to FIGS. 4 and 5, which are three-dimensional schematic diagrams of two types of the prism 210 in the optical layer 200 of the present invention. Each of the side surfaces 213 of the prism 210 further includes a plurality of sub-flat surfaces 213', which means that each of the side surfaces 213 is a composite surface with multiple flat surfaces.

Figure 4:
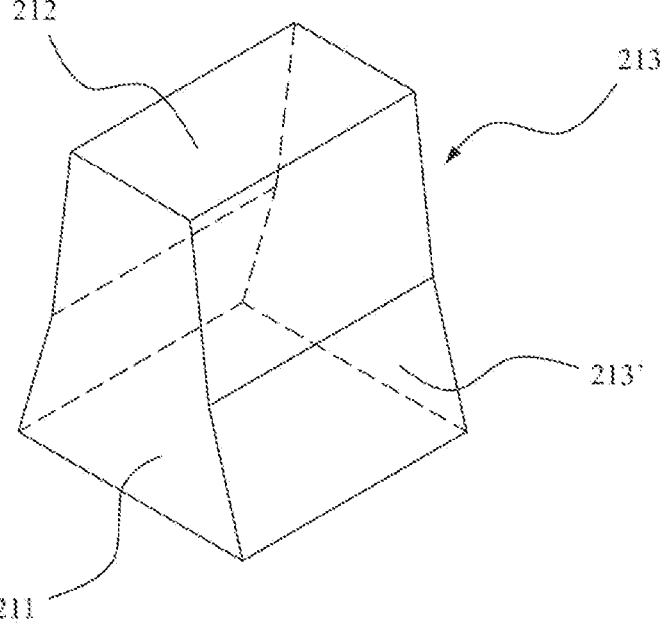
FIG. 4 is a three-dimensional schematic diagram of another prism in the optical layer of the present invention.
Figure 5:
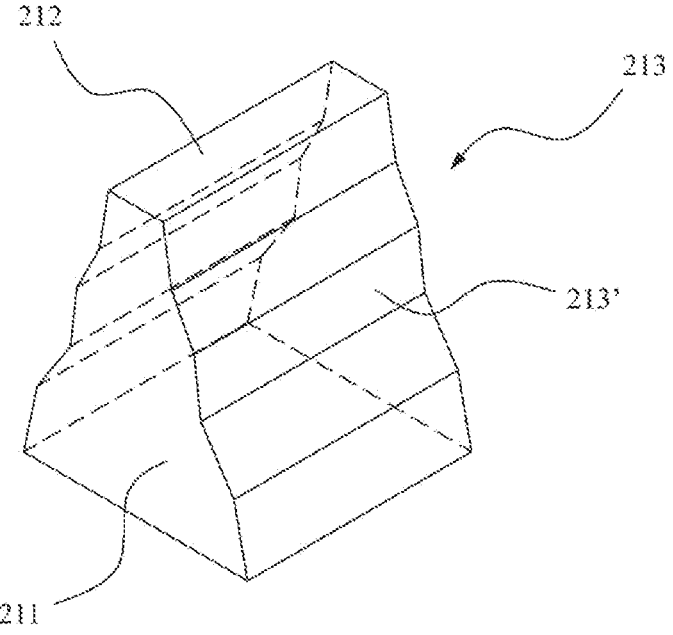
FIG. 5 is a three-dimensional schematic diagram of another prism in the optical layer of the present invention.

As shown in FIG. 4, each of the side surfaces 213 of the prism 210 further includes two sub-flat surfaces 213', which means that each of the side surfaces 213 is bent one time to form the sub-flat surfaces 213 with two inclined angles. As shown in FIG. 5, each of the side surfaces 213 of the prism 210 further includes five sub-flat surfaces 213', which means that each of the side surfaces 213 is bent four times to form the sub-flat surfaces 213' with five inclined angles.

Through the optical simulation experiments, the present invention can obtain a prism structure that can relieve the phenomenon of the brightness fluctuation observed in FIG. 1. Hereinafter, the structure of the prism 210 shown in FIG. 4 is taken as an example for description. Please refer to FIG. 6, which is a side view of the prism 210 shown in FIG. 4. In optimized values obtained by the optical simulation experiments, a distance D1 between the bottom surface 211 and the top surface 212 of the prism 210 ranges from 5 to 50 microns (μm), and preferably 20 microns. Meanwhile, an optimized width W of the bottom surface 211 of the prism 210 ranges from 5 to 50 microns, preferably 15 microns. In this configuration, the prism 210 can effectively operate according to designs of the optical simulation experiments with a limited space without excessively increasing a thickness or a weight of the display panel.

Further, the optical simulation experiments are also optimized for a shape of each of the side surfaces 213 of the prism 210 of the present invention. Among the sub-flat surfaces 213' of each of the side surfaces 213 of the prism 210, normal directions of two adjacent sub-flat surfaces 213' are different. In addition, an included angle θ between an average normal direction of each of the side surfaces 213 of the prism 213 and a normal direction N1 of the bottom surface 211 ranges from 50 to 85 degrees.

Figure 6:
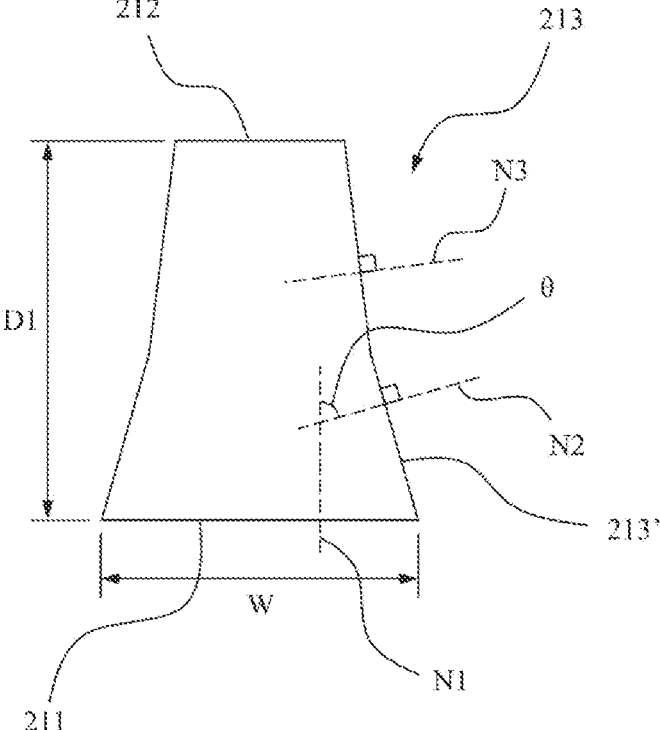
FIG. 6 is a side view of the prism shown in FIG. 4.

As shown in FIG. 6, in an embodiment, two adjacent sub-flat surfaces 213' are configured with two normal directions N2 and N3 with different angles. Since the normal direction N2 and the normal direction N3 have different directions, each of the side surfaces 213 has two sub-flat surfaces 213' with different inclined angles. Meanwhile, the included angle θ between the normal direction N2 or the normal direction N3 of any one of the sub-flat surfaces 213' and the normal direction N1 of the bottom surface 211 ranges from 50 to 85 degrees; or the included angle θ between the normal direction N2 and the average normal direction of the normal direction N3 of the sub-flat surfaces 213' and the normal direction N1 of the bottom surface 211 ranges from 50 to 85 degrees.

Figure 7:
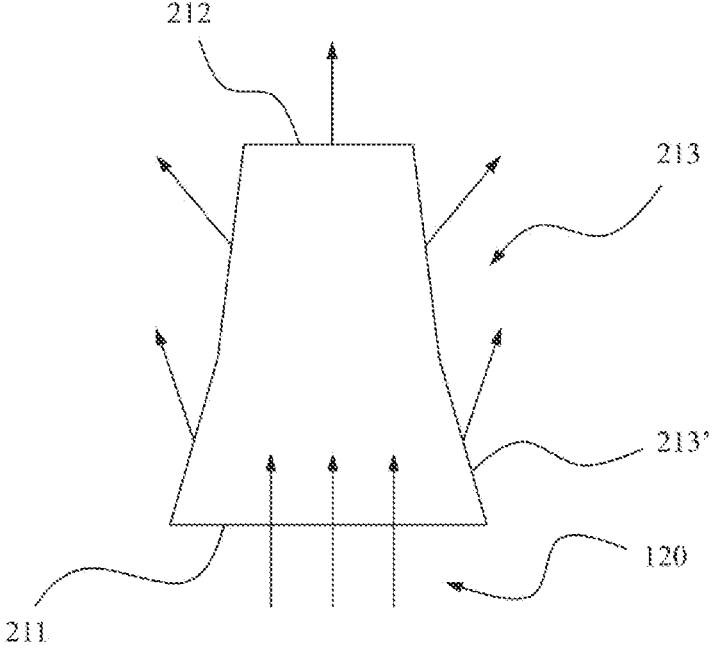
FIG. 7 is a schematic diagram showing an optical principle of the prism shown in FIG. 4.

Please refer to FIG. 7, which is a schematic diagram showing an optical principle of the prism 210 shown in FIG. 4. According to optimized data of the optical simulation experiments of the present invention, the prism 210 can change emission directions of light 120 emitted from the light-emitting surface 110 of the light-emitting substrate 100 shown in FIG. 2. FIG. 7 shows a situation that the light 120 is incident into the bottom surface 211 of the prism 210 in the optical layer 200. Since the bottom surface 211 and the top surface 212 of the prism 210 are parallel to the light-emitting substrate 100, part of the light 120 emerging from the top surface 212 remains an original incident direction. Furthermore, since the inclined angles of the side surfaces 213 have been optimized for the brightness-viewing angle relationship graph of the OLED display panel in the prior art, some parts of the light 120 emerging from the side surfaces 213 are refracted to specific angles designed by the optical simulation experiments. Therefore, the light 120 having the phenomenon of the brightness fluctuation at side viewing angles is partially dispersed by the prism 210 to other side viewing angles, thereby relieving the phenomenon of the brightness fluctuation observed in the brightness-viewing angle relationship graph of the OLED display panel in the prior art.

Figure 8:
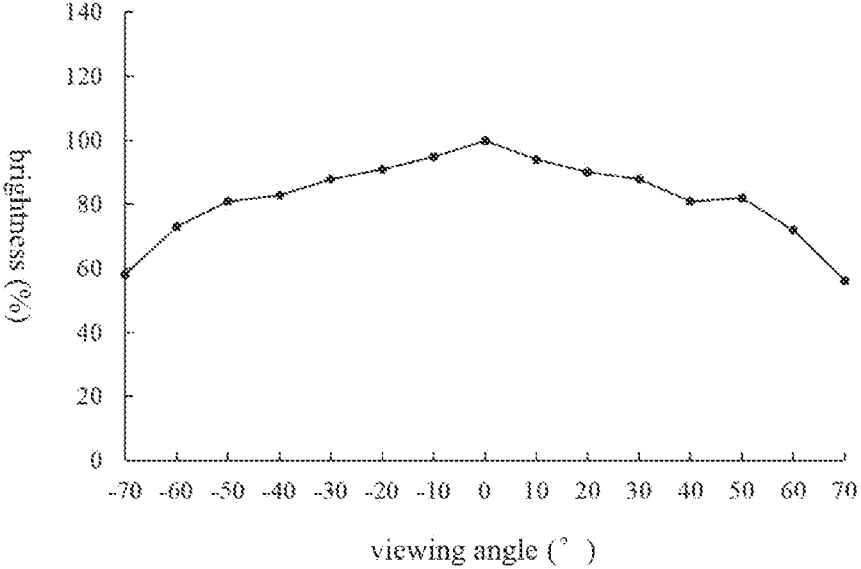
FIG. 8 is a brightness-viewing angle relationship graph of the display panel of the present invention.

Please refer to FIG. 8, which is a brightness-viewing angle relationship graph of the display panel of the present invention. By optimizing the light 120 emitted from the light-emitting substrate 100 by the prism 210 of the optical layer 200 of the present invention, the display panel of the present invention can obtain the brightness-viewing angle relationship graph as shown in FIG. 8. It is assumed that a brightness of the display panel is observed with a maximum value at a viewing angle of 0 degree, which means that the brightness of the viewing angle of 0 degrees is 100%, and it can be seen from a curve in FIG. 8 that the brightness of the display panel of the present invention gradually decreases as the viewing angle tilt, which shows a smooth viewing brightness change curve at different viewing angles.

The optical layer 200 of the present invention refracts the light 120 emitted from the light-emitting substrate 100 at a viewing angle of plus or minus 30 degrees, and refracts the light 120 to larger viewing angles. Therefore, compared with FIG. 1, the viewing brightness change curve of FIG. 8 shows that the display panel has a maximum observation brightness at the viewing angle of 0 degrees, and the observation brightness of the display panel gradually decreases as the viewing angle increases. Under an action of the prism 210 of the optical layer 200, the display panel of the present invention makes the observed brightness of the display panel smoothly decrease as the viewing angle increases. In this way, the display panel with the smooth viewing brightness change curve at different viewing angles is obtained, which can relieve a problem of the OLED display panel in prior art due to an uncertain recombination position of excitons in a light-emitting layer of an OLED device, thereby optimizing user viewing experience.

In the present invention, the optical layer 200 can further include a plurality of the prisms 210 as shown in FIGS. 3 to 5 arranged on the light-emitting surface 110 of the light-emitting substrate 100. Hereinafter, a configuration of each of the side surfaces 213 of each of the prisms 210 including two sub-flat surfaces 213' is taken as an example for description.

Figure 9:
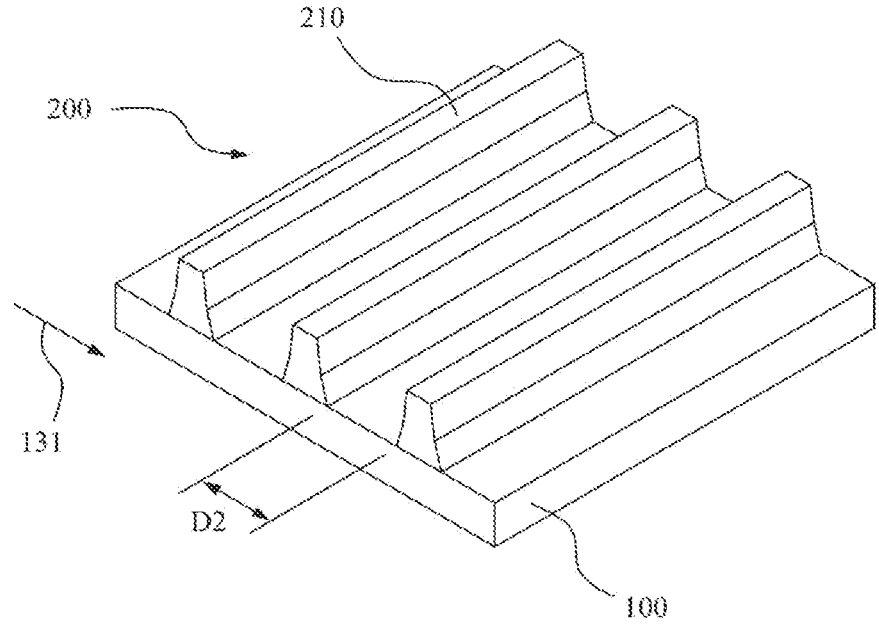
FIG. 9 is a schematic diagram of an arrangement of a plurality of the prisms in the optical layer of the present invention.

Please refer to FIG. 9, which is a schematic diagram of an arrangement of the prisms 210 in the optical layer 200 of the present invention. In an embodiment, each of the prisms 210 of the optical layer 200 is strip-shaped, and the prisms 210 are arranged at intervals along a first direction 131 on the light-emitting surface 110 of the light-emitting substrate 100. It should be explained that the first direction 131 may be a coordinate axis of a Cartesian coordinate system of the light-emitting surface 110, but is not limited to this, and may be any direction.

In this embodiment, when the strip-shaped prisms 210 are arranged along the one-dimensional first direction 131, each of the prisms 210 can refract the light 120 emitted from the light-emitting substrate 100 toward positive and negative directions of the first direction 131. Furthermore, through an optimization of the optical simulation experiments, a distance between two adjacent prisms 210 in the present invention is configured to be range from 5 to 50 microns, preferably 10 microns. By properly adjusting the distance between two adjacent prisms 210, it is possible to prevent the light 120 emitted from one of the side surfaces 213 of one of the prisms 210 from shooting into the other one of the prisms 210, causing the light 120 to be refracted multiple times, or other undesirable problems such as interference with the light 120 emitted from other directions. Meanwhile, properly adjusting the distance between two adjacent prisms 210 can maximize the optical layer 200 to improve the viewing brightness change curve of the display panel at different viewing angles.

Therefore, in the positive direction and the negative direction of the first direction 131, the viewing brightness of the display panel can smoothly decrease as the viewing angle increases. In this way, the display panel with the smooth viewing brightness change curve at different viewing angles in the positive direction and the negative direction of the first direction 131 is obtained, thereby optimizing the user viewing experience.

In addition, the strip-shaped prism 210 in this embodiment can be arranged corresponding to a column of pixels of the light-emitting substrate 100 or arranged corresponding to multiple columns of pixels, so as to individually optimize the light 120 of the pixels. It should be explained that an arrangement of the prisms 210 is designed by the optical simulation experiments to achieve the above technical effects, so the arrangement of the prisms 210 may not need to correspond to the pixels of the light-emitting substrate 100. In other words, the optical layer 200 of the present invention can be applied to any kind of light-emitting substrate, and has a considerable degree of manufacturing flexibility.

Figure 10:
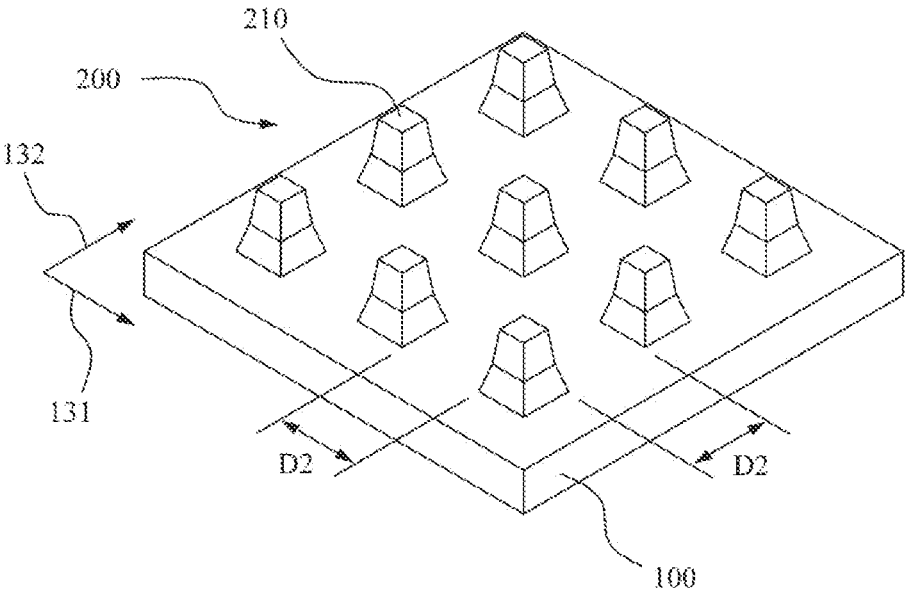
FIG. 10 is a schematic diagram of another arrangement of a plurality of the prisms in the optical layer of the present invention.

Please refer to FIG. 10, which is a schematic diagram of another arrangement of the prisms 210 in the optical layer 200 of the present invention. In an embodiment, each of the prisms 210 of the optical layer 200 is pagoda-shaped, and the prisms 210 are arranged in an array along the first direction 131 and a second direction 132 on the light-emitting surface 110 of the light-emitting substrate 100. It should be explained that the second direction 132 and the first direction 131 are perpendicular to each other, and the first direction 131 and the second direction 132 may be two mutually perpendicular coordinate axes of a Cartesian coordinate system of the light-emitting surface 110, but is not limited to this, and may be any two mutually perpendicular directions.

In this embodiment, the bottom surface 211 and the top surface 212 of each of the pagoda-shaped prisms 210 is square, and shapes of four side surfaces 213 of each of the pagoda-shaped prisms 210 are same and are symmetrical to each other. When the pagoda-shaped prisms 210 are arranged along a two-dimensional array of the first direction 131 and the second direction 132, each of the prisms 210 can refract the light 120 emitted from the light-emitting substrate 100 toward positive and negative directions of the first direction 131 and positive and negative directions of the second direction 132. Furthermore, through an optimization of the optical simulation experiments, a distance between two adjacent prisms 210 in the present invention is configured to be range from 5 to 50 microns, preferably 10 microns. By properly adjusting the distance between two adjacent prisms 210, it is possible to prevent the light 120 emitted from one of the side surfaces 213 of one of the prisms 210 from shooting into the other one of the prisms 210, causing the light 120 to be refracted multiple times, or other undesirable problems such as interference with the light 120 emitted from other directions. Meanwhile, properly adjusting the distance between two adjacent prisms 210 can maximize the optical layer 200 to improve the viewing brightness change curve of the display panel at different viewing angles.

Therefore, in the positive direction and the negative direction of the first direction 131 and the positive direction and the negative direction of the second direction 132, the viewing brightness of the display panel can smoothly decrease as the viewing angle increases. In this way, the display panel with the smooth viewing brightness change curve at different viewing angles in the positive direction and the negative direction of the first direction 131 and in the positive direction and the negative direction of the second direction 131 is obtained, thereby optimizing the user viewing experience.

In addition, the pagoda-shaped prisms 210 in this embodiment can be arranged one-to-one or one-to-many corresponding to the pixels of the light-emitting substrate 100, so as to individually optimize the light 120 of the pixels. It should be explained that an arrangement of the prisms 210 is designed by the optical simulation experiments to achieve the above technical effects, so the arrangement of the prisms 210 may not need to correspond to the pixels of the light-emitting substrate 100. In other words, the optical layer 200 of the present invention can be applied to any kind of light-emitting substrate, and has a considerable degree of manufacturing flexibility.

In the present invention, when preparing the prisms 210 of the optical layer 200, a material of the prisms 210 includes resin, and the prisms 210 are formed by an imprinting process or a photolithography process. When the prism structure is designed through the optical simulation experiments, influences of characteristics of the material of the prisms 210 on deflection angles of the light 120 emitted from the light-emitting substrate 100 will be considered at a same time.

Figure 11:
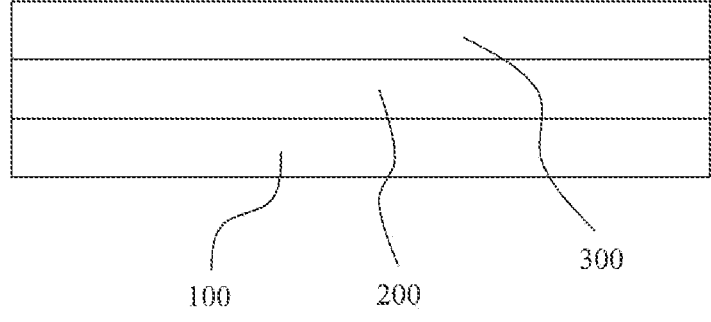
FIG. 11 is a schematic diagram of another laminated structure of the display panel of the present invention.

After the preparation of the prisms 210 of the optical layer 200 is completed, a packaging adhesive is filled between the prisms 210 to form a flat optical layer 200. Please refer to FIGS. 11 and 12, which are schematic diagrams of another two laminated structures of the display panel of the present invention. The optical layer 200 of the present invention can also cooperate with manufacture processes of the display panel. In an embodiment, as shown in FIG. 11, after the light-emitting substrate 100 is formed, the prisms 210 of the optical layer 200 can be directly formed thereon.

Figure 12:
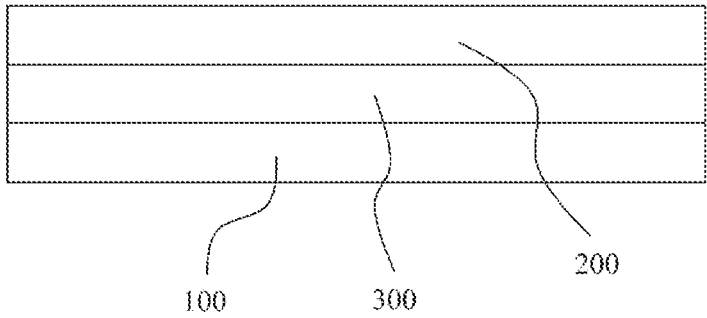
FIG. 12 is a schematic diagram of another laminated structure of the display panel of the present invention.

After the prisms 210 are filled and leveled with the packaging adhesive, the manufacturing processes of the display panel, such as forming a packaging cover plate 300 on the optical layer 200, can be continued. In another embodiment, as shown in FIG. 12, after the display panel in the prior art is manufactured, which means that the packaging cover plate 300 is already formed on the light-emitting substrate 100, the prepared optical layer 200 can be attached to the packaging cover plate 300 to achieve flexible manufacturing of the display panel.

The present invention provides the display panel with the smooth viewing brightness change curve at different viewing angles. The optical layer 200 in the display panel is disposed on the light-emitting surface 110 of the light-emitting substrate 100, and the prism 210 of the optical layer 200 has the inclined side surfaces 213, which can refract the light emitted from the light-emitting substrate 100. Furthermore, each of the side surfaces 213 of the prism 210 may include one flat surface or a plurality of sub-flat surfaces 213' with different inclined angles, so the viewing brightness change curve of the display panel of the present invention can be optimized, thereby eliminate the problem of the brightness fluctuation occurring to the prior art. In addition, in order to enhance the technical effect of the optical layer 200 at horizontal viewing angles or vertical viewing angles, the optical layer 200 further includes a plurality of the prisms 210 arranged at intervals along the first direction 131 on the light-emitting surface 110 of the light-emitting sub-strate 100, or arranged in an array along the first direction 131 and the second direction 132 perpendicular to each other. Beneficial to the technical effect and manufacturing flexibility of the optical layer 200, the optical layer 200 designed through optical simulation experiments can adapt to any kind of display panel and optimize user viewing experience.

The description above are only preferred embodiments of the invention. It should be pointed out that to those of ordinary skill in the art, various improvements and embellishments may be made without departing from the principle of the present invention, and these improvements and embellishments are also deemed to be within the scope of protection of the present invention.

What is claimed is:

1. A display panel, comprising:
a light-emitting substrate comprising a light-emitting surface, wherein the light-emitting substrate is an OLED display substrate; and
a plurality of prisms disposed separate from each other on the light-emitting surface of the light-emitting substrate, each of the prisms being configured to refract light emitted by the light-emitting substrate;
wherein the each of the prisms comprises a bottom surface, a top surface, and a plurality of side surfaces connecting the bottom surface and the top surface, the bottom surface and the top surface are parallel to the light-emitting substrate, the bottom surface is arranged adjacent to the light-emitting substrate, the top surface is arranged away from the light-emitting substrate, and an area of the top surface is smaller than an area of the bottom surface,
wherein a distance between the bottom surface and the top surface ranges from 5 to 50 microns;
wherein each of the side surfaces is composed of two sub-flat surfaces;
wherein the two sub-flat surfaces of each of the side surfaces respectively have different normal directions, and the two adjacent sub-flat surfaces are not in parallel with the light-emitting substrate and form a recess on the corresponding side surface.

2. The display panel according to claim 1, wherein the bottom surface is rectangular, and two of the side surfaces on a pair of opposite sides connecting the bottom surface and the top surface are symmetrical to each other.

3. The display panel according to claim 1, wherein the distance between the bottom surface and the top surface is 20 microns.

4. The display panel according to claim 1, wherein a width of the bottom surface ranges from 5 to 50 microns.

5. The display panel according to claim 4, wherein the width of the bottom surface is 15 microns.

6. The display panel according to claim 1, wherein an angle between an average normal direction of each of the side surfaces and a normal direction of the bottom surface ranges from 50 to 85 degrees.

7. The display panel according to claim 1, wherein the prisms are arranged at intervals along a first direction on the light-emitting surface of the light-emitting substrate.

8. The display panel according to claim 7, wherein a distance between two adjacent ones of the prisms ranges from 5 to 50 microns.

9. The display panel according to claim 8, wherein the distance between the two adjacent ones of the prisms is 10 microns.

10. The display panel according to claim 1, wherein the prisms are arranged in an array along a first direction and a second direction on the light-emitting surface of the light-emitting substrate, and the first direction and the second direction are perpendicular to each other.

11. The display panel according to claim 10, wherein a distance between two adjacent ones of the prisms ranges from 5 to 50 microns.

12. The display panel according to claim 11, wherein the distance between the two adjacent ones of the prisms is 10 microns.

13. The display panel according to claim 1, wherein a material of each of the prisms comprises resin.

14. The display panel according to claim 1, wherein each of the prisms is formed by an imprinting process or a photolithography process.

15. The display panel according to claim 1, wherein the display panel further comprises a packaging cover plate disposed on the prisms.

16. The display panel according to claim 1, wherein the display panel further comprises a packaging cover plate disposed between the light-emitting substrate and the prisms.

* * * * *